United States Patent [19]
Ghaem et al.

[11] Patent Number: 5,101,322
[45] Date of Patent: Mar. 31, 1992

[54] ARRANGEMENT FOR ELECTRONIC CIRCUIT MODULE

[75] Inventors: Sanjar Ghaem, Palatine; David W. Currier, Algonquin, both of Ill.

[73] Assignee: Motorola, Inc., Schaumburg, Ill.

[21] Appl. No.: 489,576

[22] Filed: Mar. 7, 1990

[51] Int. Cl.[5] .............................................. H05K 7/20
[52] U.S. Cl. .................................. 361/386; 335/185; 361/398; 361/413; 361/424; 439/485; 439/620
[58] Field of Search ............................... 361/382–388, 361/395, 398, 413, 414, 415, 424; 174/35 R, 51, 252, 254, 260, 261; 165/80.3, 185; 333/185; 439/65, 67, 77, 79, 92, 620, 485

[56] References Cited

U.S. PATENT DOCUMENTS

| | | | |
|---|---|---|---|
| 3,702,422 | 11/1972 | Schor | 361/405 |
| 3,790,858 | 2/1974 | Brancaleone | 174/260 |
| 3,832,603 | 8/1974 | Cray | 361/413 |
| 4,330,812 | 5/1982 | Token | 361/386 |
| 4,507,630 | 3/1985 | Wakino | 333/185 |
| 4,600,256 | 7/1986 | Anttila . | |
| 4,617,606 | 10/1986 | Shak et al. . | |
| 4,736,266 | 4/1988 | Tanibe | 361/414 |
| 4,746,893 | 5/1988 | Shak . | |
| 4,776,214 | 10/1988 | Moran et al. . | |
| 4,811,165 | 3/1989 | Currier et al. . | |
| 4,899,256 | 2/1990 | Swan-Tin | 361/380 |

OTHER PUBLICATIONS

Sheldahl, "Flexible Circuit Design Guide", Sheldahl Flexible Circuits, Advanced Interconnect products for electronic packaging, 1987, pp. 1,4,5,20.

"Electronic Packaging & Production", Sep. 1989, p. 45. Photos and Photocopies of Zeta Module, Motorola 5141550T01, 2648 09G.

Primary Examiner—Gerald P. Tolin
Attorney, Agent, or Firm—Phillip H. Melamed

[57] ABSTRACT

Electronic circuit modules (10; 100; 400) have connector (11; 111; 411) with through pins (14, 114; 414) and a metal ground path (17) embedded therein which fit within a recess (24; 124; 424) formed by a heat sink (18; 118; 418) having a central plate portion (19) surrounded by metallic cooling fins (23). A polyimide insulating circuit base film (26; 126; 500) has conductor paths (27) and circuit components (30) on at least a top surface (28) thereof with a bottom surface (31) mounted to the top surface (21) of the heat sink plate portion (19). The connector through pins are electrically connected to the conductor paths on the polyimide base film and a cover (33;133) together with the heat sink forms an internal cavity (34; 134) for protection of the components. This structure provides a compact configuration and lower manufacturing costs for a circuit module, permits reducing RF radiation and absorption problems and permits reducing resistive connections between the through pins and the components. Also implemented are high frequency bypass capacitive networks (18, 222; 118, 325) associated with each of the conductive through pins.

34 Claims, 3 Drawing Sheets

5,101,322

ARRANGEMENT FOR ELECTRONIC CIRCUIT MODULE

BACKGROUND OF THE PRESENT INVENTION

1. Field of the Invention

The present invention relates to the field of electronic circuit modules, and more particularly to the arrangement and configuration of the components which make up the module.

2. Description of the Prior Art

Some prior electronic circuit modules are hard to assemble since they typically do not provide a sequential planar stacked configuration for assembly of the module components. In addition, typically a substantial amount of mounting or fastening hardware is required for such modules increasing the cost and complexity of such modules. Also, such modules may have excessively long, and therefore excessively resistive, conductor paths. These long and complex conductor paths may also cause undesired radiation or reception of RF signals. Such prior conductor paths result because some electrical components must be provided adjacent various peripheral heat sink surfaces or some components must be provided adjacent other components, but all of the circuit output and test leads must be electrically connected to groups of closely spaced pins of one or more module connectors which provide external electrical access. In addition, such prior circuit modules may provide RF bypass capacitors for their connector leads, but this can involve excessive utilization of circuit board space for these RF bypass capacitors and prior bypass configurations may not produce optimum RF filtering results.

While some prior circuit modules have utilized polyimide flex circuits in which metalization patterns are provided on a flexible polyimide film, these modules still have many of the same problems noted above.

OBJECTS OF THE INVENTION

An object of the present invention is to provide an improved electronic circuit module which overcomes at least some of the above noted deficiencies of prior electronic circuit modules.

BRIEF DESCRIPTION OF THE DRAWINGS

The invention can be better understood by reference to the drawings in which.

DETAILED DESCRIPTION OF THE PREFERRED EMBODIMENTS

Figure 1:
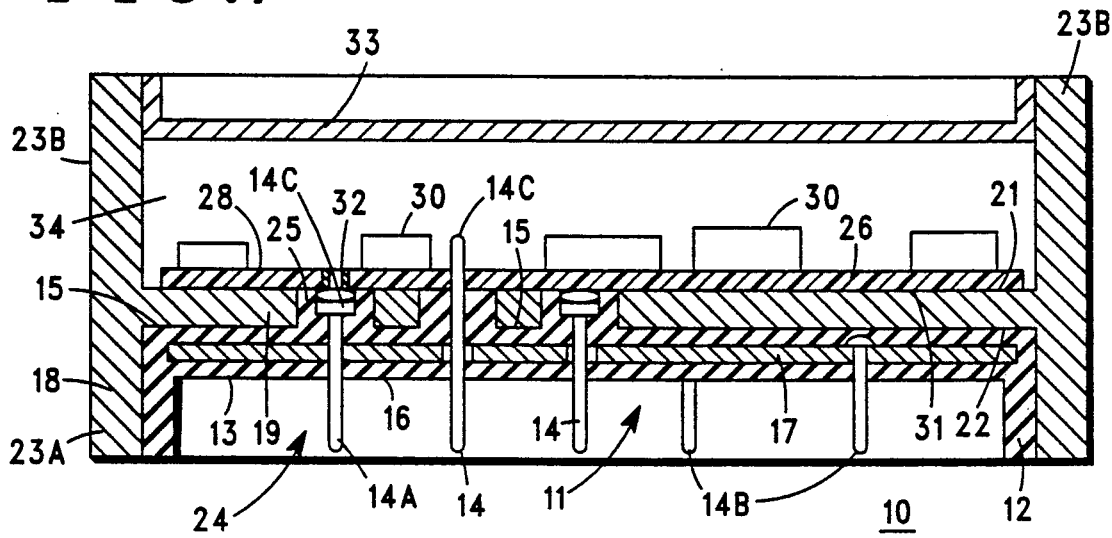
FIG. 1 is a cross sectional view of an electronic circuit module constructed in accordance with the teachings of the present invention.
Figure 2:
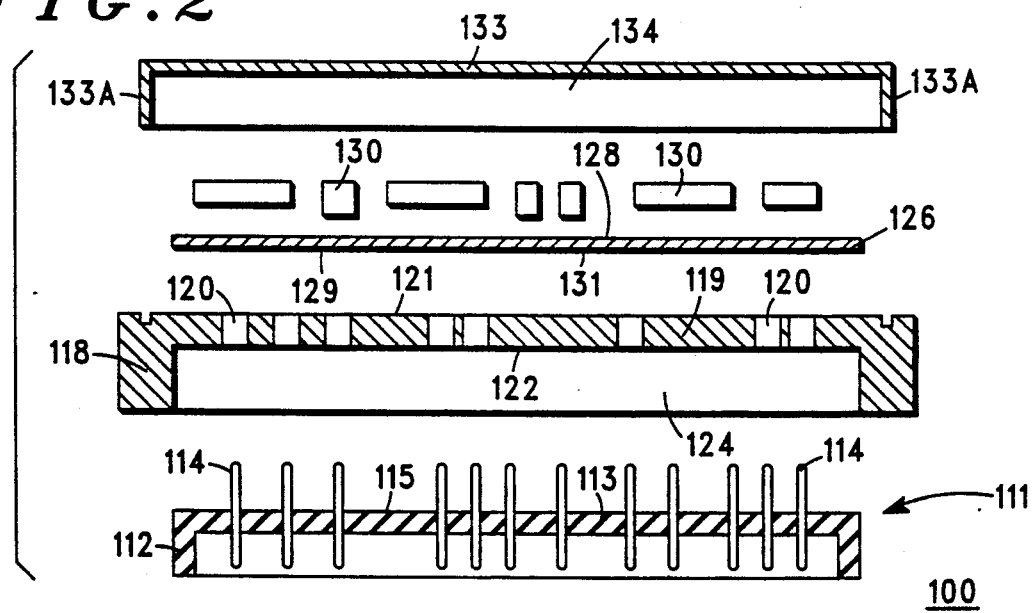
FIG. 2 is an exploded cross sectional view of a variation of the circuit module shown in FIG. 1.

Referring to FIG. 1, an electronic circuit module 10 is illustrated in cross section. FIG. 2 illustrates a similar electronic circuit module 100 shown in exploded cross sectional view. The structure of the modules 10 and 100 is very similar. The structure of module 10 will be discussed in detail. The differences between the modules 10 and 100 will also be noted.

The circuit modules 10 and 100 each include connector subassemblies 11 and 111, respectively. The subassembly 11 comprises a connector main insulating body 12 having a central planar plate portion 13 with a plurality of metallic through pins 14 embedded therein and extending at least between a top surface 15 of the central plate portion 13 and a bottom surface 16 thereof. In addition, a metal ground path 17 is embedded in the central portion 13 and is directly electrically DC low resistance connected to at least several of the embedded pins 14, such as pins 14A and 14B shown in FIGS. 1 and 6. The connector main insulating body 12 is preferably a molded plastic component which is molded around the metal ground path 17. The main insulating body 12 is also either molded around the through pins 14 or the through pins 14 are subsequently inserted into a preformed molded plastic structure comprising the main body 12. In the latter case, there are pre-existing openings in the main body 12 into which the pins are inserted, and it may be necessary to weld or press fit or adhesively fix the pins 14 to the main body 12 to create the subassembly 11 such that the pins are fixed to the main body 12. This results in the connector subassembly 11 comprising a "bed of nails" type structure in which the pins 14 are rigidly joined to the insulating body 12.

Figure 4:
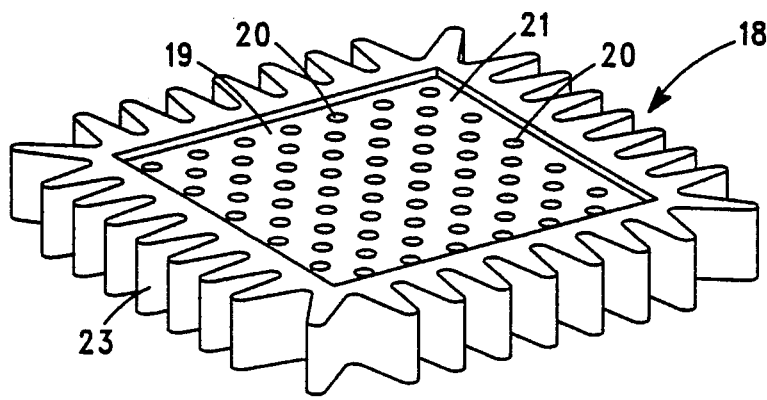

The circuit module 10 includes a thermally conductive metallic heat sink 18. The heat sink 18 includes a central plate portion 19 with a plurality of through holes 20 being provided therein which extend between top and bottom surfaces 21 and 22 of the central plate portion 19, respectively. The heat sink 18 has a plurality of cooling heat sink fins 23 which are integral with the central plate portion 19 and are positioned peripherally about peripheral portions of the central plate portion 19. This is best illustrated in FIG. 4 which illustrates a perspective view of the heat sink 18. The heat sink 18 also includes a recessed portion 24 bounded by at least the bottom surface of the central plate portion 19 of the heat sink and bottom projecting portions 23A of the fins 23. The connector main body 12, or at least a substantial portion thereof including the central portion 13 of the main body 12, is received within the recessed portion 24 of the heat sink with the bottom surface 22 of the heat sink central plate portion 19 being positioned adjacent and facing the top surface 15 of the main insulating body central portion 13.

Figure 8:
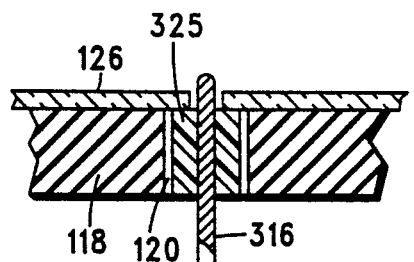
FIG. 8 is an enlarged cross sectional view of another element of the circuit modules shown in FIGS. 1 and 2 illustrating a variation for implementing a filter capacitor.

In FIG. 1, the main insulating body 12 has a plurality of concentric projections 25 thereof extending upward from the top surface 15 and surrounding each of the through pins 14 as these pins and the concentric projections enter the metallic heat sink through holes 20. These projections are used to insure the electrical insulation of the pins 14 from the metallic heat sink plate 19 as these pins extend into the openings 20. FIG. 8 illustrates an alternative type of insulating protection for the pins 14, suitable for the module 100 in FIG. 2.

It should be noted that for the circuit modules 10 and 100 shown in FIGS. 1 and 2, elements identified by reference numerals in FIG. 1 correspond to the elements in FIG. 2 identified by the same reference numeral to which the number 100 has been added. Basically, the circuit modules 10 and 100 substantially correspond to one another except that the configuration of the upper portion of the heat sinks 18 and 118 is somewhat different and the circuit module 10 uses the projections 25 of the connector main insulating body 12 to prevent shorting of the through pins 14 to the heat sink, whereas the circuit module 100 utilizes a different concentric insulator to provide a similar function wherein this is generally indicated in FIG. 8. In addition, the circuit modules 10 and 100 have different cover configurations for the module which will be discussed subsequently.

Each of the circuit modules 10 and 100 includes a flexible circuit board 26 and 126, respectively, having a plurality of conductive paths 27 and 127 provided on top surfaces 28 and 128 of major planar portions 29 and 129 thereof. The flexible circuit board preferably comprises a single or double sided polyimide base film metalized circuit. A plurality of discrete electrical circuit components 30 are mounted on and connected to the conductive paths on the top surface of the major planar portion of the circuit boards. A bottom surface 31 of the flexible circuit board major planar portion 29 is mounted adjacent and on top of the top surface 21 of the central plate portion 19 of the heat sink. In addition, a plurality of through holes 32 are provided in the flexible circuit board major planar portion 29 and the through pins 14 are electrically connected to the conductive paths 27 on the flexible circuit board 26.

In FIG. 1, the circuit board 26 is contemplated as comprising a double sided polyimide flexible film which has conductive circuit metallization patterns on both the top and bottom surfaces with the holes 32 comprising plated through metalized holes connecting the top and bottom conductive circuit paths. For the module 10 in FIG. 1, the plurality of through pins 14 each have an end portion 14C positioned adjacent an associated one of the through holes 32 in the flexible circuit board 26. The pin ends 14C are connected to the conductive circuit paths 27 adjacent the holes 32 via solder or some other type of electrical connection means. FIG. 1 illustrates that sometimes the electrical connection exists between conductive metallizations on the bottom surface 31 of the flexible circuit board and the end portions 14C of the pins, and at other times the through pins 14 extend through the holes 32 in the circuit board such that the end portions 14C protrude through the circuit board and are positioned directly adjacent to and soldered to the conductive circuit paths 27 on the top surface 28 of the flexible circuit board. This latter configuration is preferred since it permits visual inspection of the solder connections between the through pins and the conductive circuit paths provided on the flexible circuit board.

Figure 10:
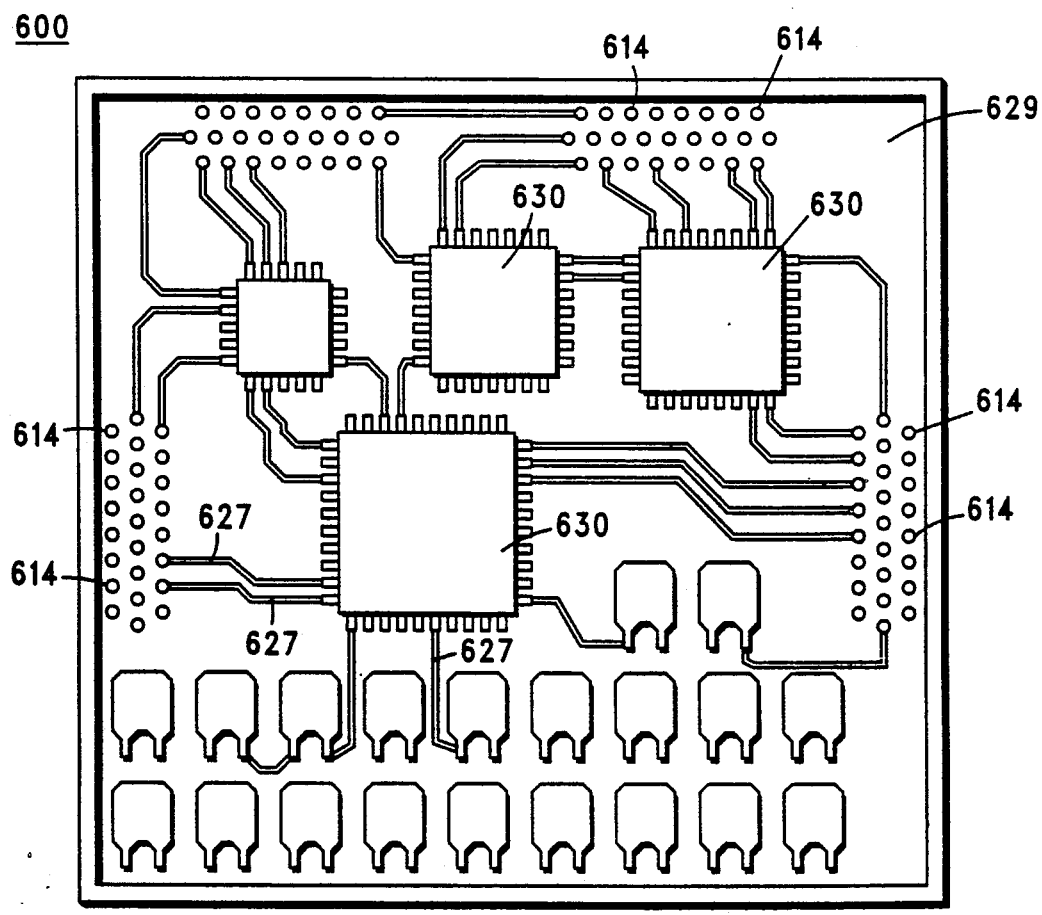
FIG. 10 is a top plane view of a portion of a circuit module having different pin locations than the circuit modules shown in FIGS. 1 and 2.

The discrete circuit components 30 are positioned substantially adjacent and randomly about the through pins 14 and their associated holes 32 in the flexible circuit board 26. In addition, the through pins 14 are preferably disposed over substantially all of the major planar portion of the flexible circuit board 26. This provides a substantial advantage in that it avoids having to provide long horizontal or surface running conductor paths on the flexible circuit board 26 between the location of a circuit component and a desired external input/output lead to be connected to the circuit component. This is achieved by disposing the conductor pins over substantially all of the major planar portion 29 of the circuit board on which the circuit components 30 are to be mounted. This is contrasted with prior modules in which all input/output conductive paths were routed to one or more rows of closely spaced external connector pins about which discrete components could not be randomly positioned since there was insufficient space to locate components as desired, such as between connector pins. FIG. 10 illustrates a portion of a circuit module 600, similar to modules 10 and 100 but having no cover and a somewhat different pin location configuration, but still having at least some components positioned between through pins 614 on the top surface of a circuit board 629.

Heatsinking for the components 30 is provided by the pins 14 and by having heat conducted through the thin polyimide base film which forms the flexible circuit board 26. Heat is conducted through the polyimide film from the circuit components 30 to the heat sink central plate portion 19 and then through this plate portion to the integral cooling heat sink fins 23. Thus again long conductive circuit paths on the circuit board 26 are avoided since the polyimide substrate forming the flexible circuit board 26 is utilized to directly conduct heat downward and away from the components 30 into the heat sink 18.

The components 30, as noted previously, are mounted on the circuit metallization conductive paths 27 on the top surface of the flexible circuit board. Preferably this is accomplished by top side solder reflow techniques. Subsequently, a cover 33 is provided which is connected to the heat sink 18 and connector subassembly 11 to form an internal protective cavity 34 in which the components 30 are provided. The cover 33 and the heat sink 18 together form at least part of the boundaries of this internal protective cavity 34 in which the components 30 and the flexible circuit board 26 are provided.

The following differences and similarities between the modules 10 and 100 exist.

Figure 3:
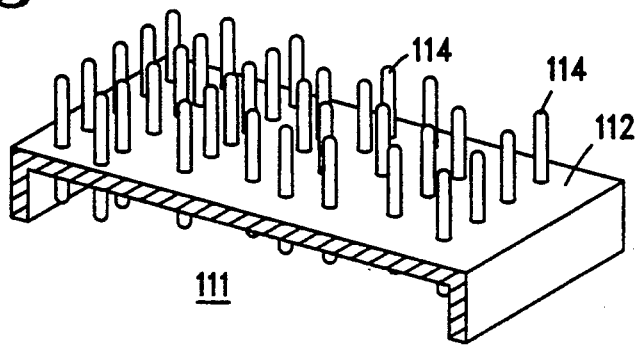
FIGS. 3, 4 and 5 are perspective views of some of the elements of the circuit modules shown in FIGS. 1 and 2.
Figure 5:
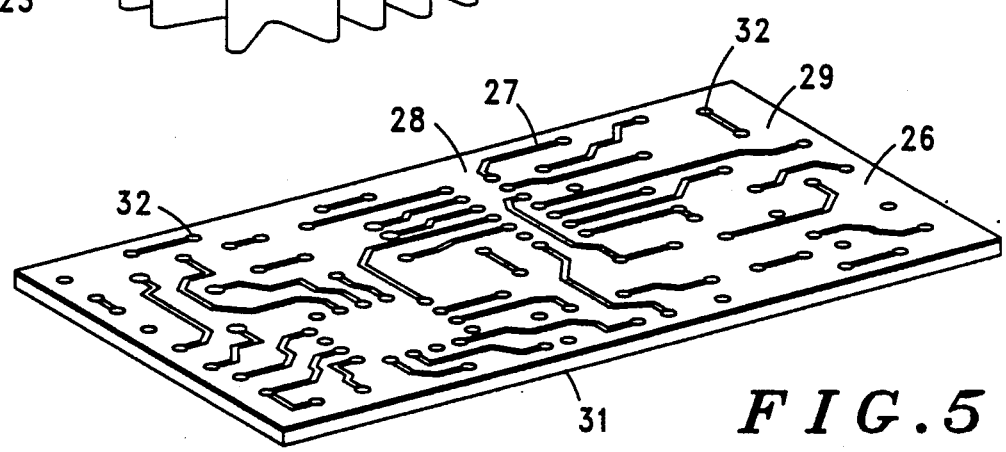

FIG. 3 illustrates a perspective view of the connector subassembly 111 wherein concentric projections, similar to projections 25, of the insulating main body 112 are not shown but could be provided. The subassembly 111 shown in FIG. 3 could also be utilized in the circuit module 10 shown in FIG. 1. FIG. 4 illustrates a preferred configuration for the heat sink 18 shown in FIG. 1. The corresponding heat sink 118 shown in FIG. 2 differs from the heat sink 18 shown in FIG. 1 only in that the heat sink 18 has upper projecting portions 23B of the heat sink fins which together with the cover 33 form part of the boundaries of the internal cavity 34. For the circuit module 100, the cover 133 has downward projecting portions 133A which replace the upward projecting heat sink fins 23A and provide a similar protection function for enclosing the internal protection cavity 134 for the components. FIG. 5 illustrates a perspective view of the flexible circuit board 26 wherein this board substantially directly corresponds to the circuit board 126 shown in FIG. 2. In both cases, the circuit board 26 or 126 can be either a single sided polyimide flex circuit or a double sided polyimide flex circuit each having through holes therein which can comprise plated through holes connecting top and bottom side conductive paths.

For the circuit modules 10, 100 and 600 shown in FIGS. 1, 2 and 10, each implement a circuit module by sequential planar stacking of different mechanical elements of the circuit module wherein this can be achieved in a cost effective space optimizing configuration. Thus each of the modules 10, 100 and 600 represent an improved circuit module as compared to the prior art. Each module 10 and 100 enables the minimization of long conductive circuit paths since the through pins 14 and 114 are disposed over substantially the entire component bearing surface area of the flexible circuit boards 26 or 126. The recessed portions 24, 124 of the heat sink also protect the connector main insulating bodies 12 and 112, while the heat sink forms a protective module housing.

Figure 6:
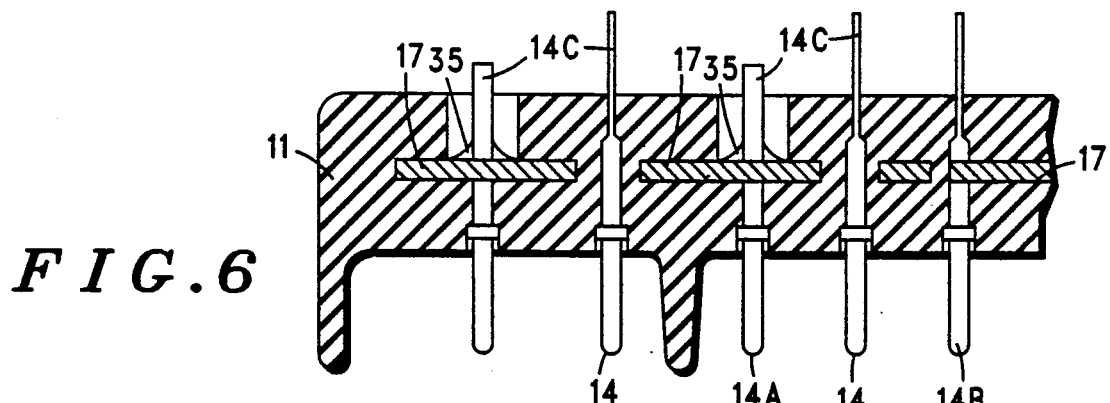
FIG. 6 is an enlarged cross sectional view of a portion of one of the elements of the circuit modules shown in FIGS. 1 and 2.

FIG. 6 illustrates how the embedded metal ground path 17 may be connected, via solder connections 35, to various ones of the plurality of through pins 14 such that an effective ground connection can be provided at various locations on the circuit board 26. This is very advantageous for RF circuit boards in which providing a reliable ground connection at various locations on the circuit board is essential such that just providing a surface conductive path on the circuit board which routes ground to many locations on the circuit board may not prove electrically sufficient. Also using conductive paths on the circuit board 26 for all ground routing would complicate the board 26 and utilize valuable circuit board surface area.

Figure 7:
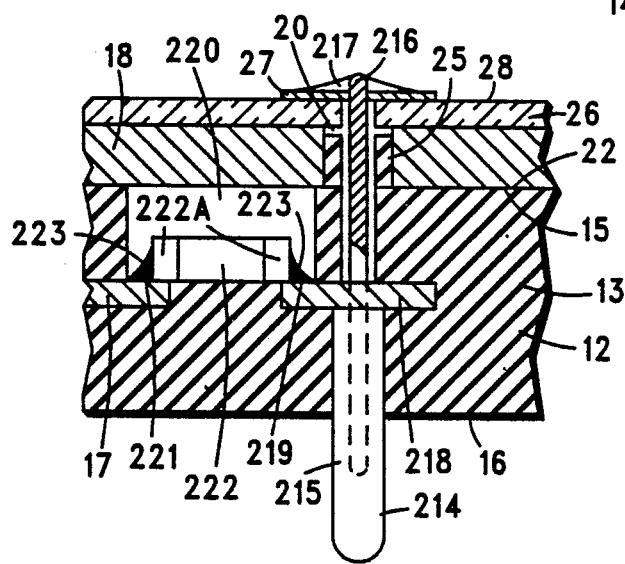
FIG. 7 is an enlarged cross sectional view of a variation of the element shown in FIG. 6 illustrating the positioning of a filter capacitor.

Referring now to FIGS. 7 and 8, an additional aspect of the present invention will now be discussed with regard to how RF bypass capacitors can be electrically connected to the plurality of lead pins 14. Referring to FIG. 7, a portion of the circuit module 10 is illustrated in which the structure adjacent a single through pin 214, comprising one of the through pins 14, is illustrated in cross section. The through pin 214 has a main bottom conductive projection portion 215 which extends beyond and away from the main insulating body plate portion 13 and its bottom surface 16. Within the main body plate portion 13, an upper projection portion 216 of the through pin 214 is provided. This upper projection portion 216 extends beyond the top surface 28 of the flexible circuit board 26 and is connected via a solder connection 217 to the conductive metallization path 27 on the flexible circuit board 26. FIG. 7 illustrates in somewhat more detail than in FIG. 1 the providing of the concentric projections 25 of the main insulating body 12 which prevent accidental shorting of the connector pin portion 216 to the metallic heat sink 18 as the portion 216 extends through the heat sink through hole 20.

FIG. 7 illustrates a conductive horizontal projection 218 which is provided adjacent and connected to the through pin 214. This projection 218 has a solderable surface 219 which extends into a recessed portion 220 in the connector portion 13 which is provided below the bottom surface 22 of the heat sink 18. In addition, a solderable surface 221 of the metal ground path 17 is also provided in the recessed portion 220 along with a capacitor 222, preferably implemented as a chip capacitor, having end metalizations 222A connected to the solderable surfaces 219 and 221 via solder connections 223. This configuration results in providing an RF capacitive bypass between the pin 214 and ground potential. This is achieved without utilization of any of the conductive circuit path area provided on the flexible circuit board 26, and without mounting any bypass capacitors on the circuit board 26. Thus a substantial savings in the surface area utilized on the circuit board 26 is achieved. If desired, the extending portions 216 or 215 of the pin 214 can be made with a resistance of more than 5 ohms such that this more resistive element, with the capacitor 222, can form an RC filter connected to the through pin 214.

Referring to FIG. 8, an alternative configuration is illustrated for use with the circuit module 100 in which again an RF bypass capacitance is provided for the through pins 14. In FIG. 8, a portion of the heat sink 118 and the flexible circuit board 126 are illustrated in conjunction with a single through pin 314 again having a lower portion 315 corresponding to the portion 215 in FIG. 7 and an upper portion 316 corresponding to the portion 216 in FIG. 7. However, in FIG. 8, instead of providing a concentric projection 25 of the insulating connector body 12, a high dielectric constant concentric annular ring 325 is provided surrounding the upper portion 316 of the through pin 314 in a through opening 120 in the heat sink 118. This again provides a high frequency bypass capacitance between the through pin 314 and the heat sink 118 wherein this heat sink 118 is now connected to ground potential. Thus again an RF capacitance to ground is provided for circuit module lead outs. The upper portion 316 of the through pin 314 can be made with a resistance of more than 5 ohms if an RC filter connection is desired rather than just a bypass capacitance connection between the pin 314 and ground potential.

Figure 9:
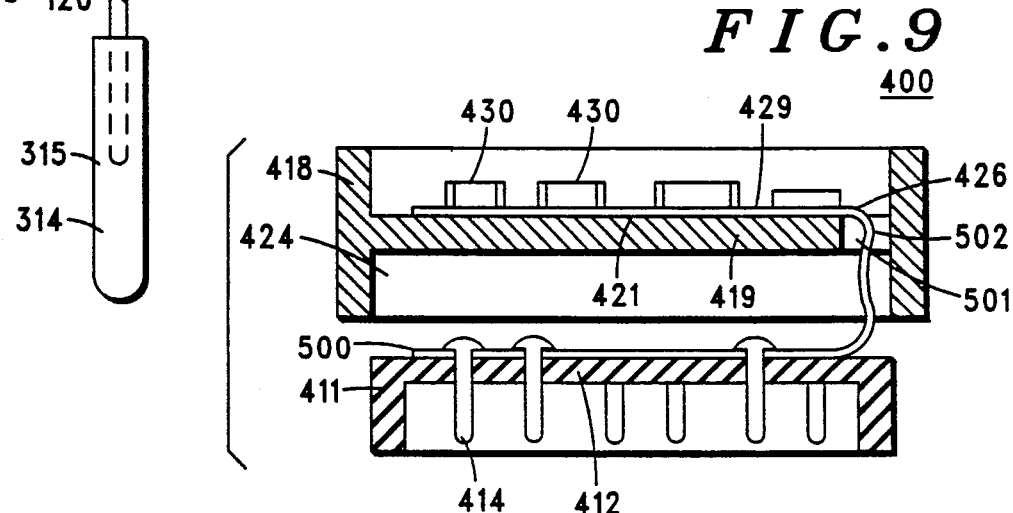
FIG. 9 is a cross sectional view of a circuit module which differs somewhat from the configuration of the circuit modules shown in FIGS. 1 and 2.

Referring to FIG. 9, a cross sectional view of portions of a circuit module 400 is illustrated wherein this module has many of the same structural characteristics as the circuit modules 10 and 100 illustrated in FIGS. 1 and 2. In FIG. 9, again a "bed of nails" connector subassembly 411 is provided with through pins 414 embedded in a main plastic insulating connector body 412 of the connector. Again, the main body 412 is intended for reception within a recessed portion 424 of a metal heat sink 418 having a central plate portion 419. This allows the metal heat sink to provide mechanical protection for the plastic connector body, as is the case for modules 10 and 100.

For module 400, now the through pins 414 do not protrude through openings in the central plate portion 419 of the heat sink, but merely extend above the top surface of the connector insulating body 412 and connect to conductive circuit paths provided on an extension 500 of a flexible circuit board 426 which is mounted on a top surface 421 of the heat sink plate portion 419. Again, discrete components 430 are provided on a major planar portion 429 of the circuit board 426 which is mounted on the heat sink top surface 421. While the connector pins 414 do not extend through the heat sink plate portion 419, a through opening 501 is provided in the heat sink plate portion 419 and the components 430 are connected to the pins 414 via the circuit board extension 500. The extension 500 is an integral portion of the circuit board 426 and has an intermediate portion 502 which passes through the opening 501 in the heat sink plate portion 419. Each of the portions 429 and 500 of the circuit board 426 are substantially planar but are arranged in different substantially parallel planes. In addition, a polyimide base, which forms the circuit 426, is preferably a double side metallized circuit board with plated through conductive through holes therein to facilitate connection of the pins 414 to conductive metallization paths on the top surface of the flexible circuit portion 429 shown in FIG. 9. The structure of the circuit module 400 is a stacked planar configuration, similar to that shown for modules 10 and 100, and represents a compact and readily manufacturable circuit module. Clearly providing the module 400 with an embedded ground path 17 in the connector main body 412 and the bypass capacitor configuration shown in FIG. 7 can be readily advantageously implemented.

FIG. 10 shows the top view of a portion of circuit module 600 which is very similar to the modules 10 and 100 except the pins 614 are arranged in four major noncontiguous groupings of pins disposed about the periphery of circuit board 629. Components 630 are positioned on the top surface of planar circuit board 629, connected to conductive paths 627 on the top surface and positioned between at least some of the pins 614. The circuit board 629 is preferably mounted to a heat sink plate and preferably all of the pins 614 extend from a plastic connector main body through the heat sink and then through the circuit board 629. This configuration allows the use of four standard connectors to contact the four groupings of pins 614 from below the connector main body while still minimizing the lengths of some conductive paths 627 provided on the circuit board 629. This also avoids congestion which would result if all conductive paths were routed to a single contiguous grouping of closely spaced pins. Only some of the conductive paths 627 are shown in FIG. 10. The main connector body for the module 600 is positioned in a recess in the heat sink for the module such that a planar stacked configuration for the module 600 is achieved while the heat sink functions as the module's protective housing. If desired, each of the pins of each of the four pin groupings for module 600 could pass through an associated one of four noncontiguous through holes in the heat sink.

While we have shown and described specific embodiments of this invention, further modifications and improvements will occur to those skilled in the art. All such modifications which retain the basic underlying principles disclosed and claimed herein are within the scope of this invention.

We claim:

1. An electronic circuit module comprising:
   connector means having a main insulating body with a plurality of separate through pins therein each extending at least from top to bottom opposite surfaces of said main body;
   a thermally conductive heat sink means having a central plate portion with a plurality of through holes therein extending between top and bottom opposite surfaces of said central plate portion, said central plate portion bottom surface mounted adjacent said main body top surface with each of said plurality of pins extending into an associated one of said through holes in said central plate portion; and
   circuit board means having a plurality of conductive paths on a top surface of a major planar portion of an insulating circuit base, and a plurality of electrical components mounted on and connected to said conductive paths on said top surface of said insulating base major planar portion, said insulating circuit bas of said major planar portion having a bottom surface mounted adjacent said top surface of said heat sink plate portion;
   wherein said through pins are electrically connected to said conductive paths and are positioned adjacent associated through holes in said insulating circuit base, wherein said plurality of components are positioned substantially adjacent and randomly about said pins and their associated through holes in said insulating circuit base, and wherein said heat sink means includes a recessed portion bounded by at least said bottom surface of said central plate portion, at least a substantial portion of said connector means main body being received in said recessed portion.

2. An electronic circuit module according to claim 1 wherein said heat sink means includes heat sink cooling fins peripherally disposed about and connected to peripheral portions of said heat sink plate portion.

3. An electronic circuit module according to claim 2 wherein said heat sink fins and said heat sink plate portion are integral.

4. An electronic circuit module according to claim 1 wherein said major planar portion of said insulating circuit base comprises a metallized polyimide film having said connective paths and said plurality of electrical components provided thereon.

5. An electronic circuit module according to claim 1 wherein said connector means main body comprises an insulating material having a metallic ground path embedded therein, at least several of said through pins being directly electrically DC connected thereto by a low resistance connection.

6. An electronic circuit module comprising:
   connector means having a main insulating body with a plurality of separate through pins therein each extending at least from top to bottom opposite surfaces of said main body;
   a thermally conductive heat sink means having a central plate portion with a plurality of through holes therein extending between top and bottom opposite surfaces of said central plate portion, said central plate portion bottom surface mounted adjacent said main body top surface with each of said plurality of pins extending into an associated one of said through holes in said central plate portion; and
   circuit board means having a plurality of conductive paths on a top surface of a major planar portion of an insulating circuit base, and a plurality of electrical components mounted on and connected to said conductive paths on said top surface of said insulating base major planar portion, said insulating circuit base of said major planar portion having a bottom surface mounted adjacent said top surface of said heat sink plate portion;
   wherein said through pins are electrically connected to said conductive paths and are positioned adjacent associated through holes in said insulating circuit base, wherein said plurality of components are positioned substantially adjacent and randomly about said pins and their associated through holes in said insulating circuit base, and wherein said connector main body comprises an insulating material having a metal ground path embedded therein and connected to at least one of said through pins via a direct electrical DC connection thereto, said connector including a plurality of recessed portions therein in which capacitors are positioned capacitively coupling at least several of said through pins to said embedded ground path.

7. An electronic circuit module according to claim 6 wherein said capacitors comprise discrete chip capacitors having a pair of end metallizations, one of which is connected to said embedded ground path and the other of which is connected to an associated one of said through pins.

8. An electronic circuit module comprising:
connector means having a main insulating body with a plurality of separate through pins therein each extending at least from top to bottom opposite surfaces of said main body;
a thermally conductive heat sink means having a central plate portion with a plurality of through holes therein extending between top and bottom opposite surfaces of said central plate portion, said central plate portion bottom surface mounted adjacent said main body top surface with each of said plurality of pins extending into an associated one of said through holes in said central plate portion; and
circuit board means having a plurality of conductive paths on a top surface of a major planar portion of an insulating circuit base and a plurality of electrical components mounted on and connected to said conductive paths on said top surface of said insulating base major planar portion, said insulating circuit base of said major planar portion having a bottom surface mounted adjacent said top surface of said heat sink plate portion;
wherein said through pins are electrically connected to said conductive paths, and wherein said main connector body includes extending projections thereof which surround said through pins as said pins extend into said through holes in said plate portion of said heat sink means.

9. An electronic circuit module comprising:
connector means having a main insulating body with a plurality of separate through pins therein each extending at least from top to bottom opposite surfaces of said main body;
a thermally conductive heat sink means having a central plate portion with a plurality of through holes therein extending between top and bottom opposite surfaces of said central plate portion, said central plate portion bottom surface mounted adjacent said main body top surface with each of said plurality of pins extending into an associated one of said through holes in said central plate portion; and
circuit board means having a plurality of conductive paths on a top surface of a major planar portion of an insulating circuit base, and a plurality of electrical components mounted on and connected to said conductive paths on said top surface of said insulating base major planar portion, said insulating circuit base of said major planar portion having a bottom surface mounted adjacent said top surface of said heat sink plate portion;
wherein said through pins are electrically connected to said conductive paths, and wherein said connector main body comprises a plastic part molded around said through pins so as to form an integral pin and connector body assembly.

10. An electronic circuit module comprising:
connector means having a main insulating body with a plurality of separate through pins therein each extending at least from top to bottom opposite surfaces of said main body;
a thermally conductive heat sink means having a central plate portion with a plurality of through holes therein extending between top and bottom opposite surfaces of said central plate portion, said central plate portion bottom surface mounted adjacent said main body top surface with each of said plurality of pins extending into an associated one of said through holes in said central plate portion; and
circuit board means having a plurality of conductive paths on a top surface of a major planar portion of an insulating circuit base, and a plurality of electrical components mounted on and connected to said conductive paths on said top surface of said insulating base major planar portion, said insulating circuit base of said major planar portion having a bottom surface mounted adjacent said top surface of said heat sink plate portion;
wherein said through pins are electrically connected to said conductive paths, and wherein said connector body comprises a preformed molded plastic part into which connector pins are inserted to form an assembly comprising said connector body and said through pins.

11. An electronic circuit module comprising:
connector means having a main insulating body with a plurality of separate through pins therein each extending at least from top to bottom opposite surfaces of said main body;
a thermally conductive heat sink means having a central plate portion with a plurality of through holes therein extending between top and bottom opposite surfaces of said central plate portion, said central plate portion bottom surface mounted adjacent said main body top surface with each of said plurality of pins extending into an associated one of said through holes in said central plate portion; and
circuit board means having a plurality of conductive paths on a top surface of a major planar portion of an insulating circuit base, and a plurality of electrical components mounted on and connected to said conductive paths on said top surface of said insulating base major planar portion, said insulating circuit base of said major planar portion having a bottom surface mounted adjacent said top surface of said heat sink plate portion;
wherein said through pins are electrically connected to said conductive paths, and wherein said through pins, as they extend into said heat sink plate portion through holes are surrounded by concentric high dielectric constant spacers so as to provide a substantial capacitance between said through pins and said heat sink plate portion which comprises a metallic electrically connective plate.

12. An electronic circuit module comprising:
connector means having a main insulating body with a plurality of separate through pins therein extending at least between top and bottom surfaces of said main body;
a thermally conductive heat sink means having a central plate portion with at least one through opening therein extending between top and bottom surfaces of said plate portion said plate portion bottom surface mounted facing said main body top surface; and
circuit board means having a plurality of conductive paths on a top surface of a major planar portion on an insulating circuit base, and a plurality of electrical components mounted on and connected to said conductive paths on said top surface of said insulating circuit base major planar portion, said insulating circuit base having a bottom surface mounted adjacent said top surface of said heat sink plate portion;

wherein said through pins are electrically connected to said conductive paths via an integral extension of said insulating circuit base which has an intermediate portion which passes through said opening in said central plate portion of said heat sink means, and wherein a planar portion of said extension is positioned on said connector means top surface and has conductive paths thereon connected to said plurality of components and adjacent and in connection with said through pins in said connector means.

13. An electronic circuit module according to claim 12 wherein said heat sink means includes heat sink cooling fins peripherally disposed about and connected to peripheral portions of said heat sink plate portion.

14. An electronic circuit module according to claim 12 wherein said insulating circuit base comprises a metallized polyimide film having conductive paths thereon.

15. An electronic circuit module according to claim 14 wherein said extension planar portion of said insulating base has through holes therein associated with and positioned adjacent to said through pins.

16. An electronic circuit module according to claim 15 wherein said through pins extend through said through holes in said extension planar portion of said insulating base.

17. An electronic circuit module according to claim 16 wherein said heat sink means includes a recessed portion bounded by at least said bottom surface of said central plate portion, at least a substantial portion of said connector means main body being received in said recessed portion.

18. An electronic circuit module according to claim 12 wherein said heat sink means includes a recessed portion bounded by at least said bottom surface of said central plate portion, at least a substantial portion of said connector means main body being received in said recessed portion.

19. An electronic circuit module comprising:
connector means having a main insulating body with a plurality of separate through pins therein each extending at least from top to bottom surfaces of said main body;
a thermally conductive heat sink means having a central plate portion with at least one hole therein extending between top and bottom surfaces of said plate portion, said plate portion bottom surface mounted facing said main body top surface; and
circuit board means having a plurality of conductive paths on a top surface of a major planar portion of an insulating circuit base, and a plurality of electrical components mounted on and connected to said conductive paths on said top surface of said insulating circuit base major planar portion, said insulating circuit base having a bottom surface mounted adjacent said top surface of said heat sink central plate portion;
wherein said through pins are electrically connected to said conductive paths and wherein said heat sink means includes a recessed portion bounded by at least said bottom surface of said central plate portion, at least a substantial portion of said connector means main body being received in said recessed portion.

20. An electronic circuit module according to claim 19 wherein said heat sink means includes heat sink cooling fins which are disposed peripherally about and connected to peripheral portions of said heat sink plate portion.

21. An electronic circuit module according to claim 20 wherein said heat sink fins and said heat sink plate portion are integral.

22. An electronic circuit module according to claim 20 wherein said heat sink fins extend at least below said heat sink plate portion and form the outer surface of a peripheral portion of said heat sink recessed portion.

23. An electronic circuit module according to claim 22 wherein said heat sink fins also extend above said heat sink plate portion and, together with a cover and said heat sink plate portion, form a protective cavity within which said plurality of components are provided.

24. An electronic circuit module according to claim 19 which includes a cover mounted to said heat sink means for forming a protective cavity within which said plurality of components are provided.

25. An electronic circuit module comprising:
connector means having a main insulating body with a plurality of separate through pins therein each extending at least from top to bottom opposite surfaces of said main body;
a thermally conductive heat sink means having a metallic central plate portion with a plurality of through holes therein extending between top and bottom opposite surfaces of said central plate portion, said central plate portion bottom surface mounted adjacent said main body top surface with each of said plurality of pins extending into an associated one of said through holes in said central plate portion; and
circuit board means having a plurality of conductive paths on a top surface of a major planar portion of an insulating circuit base, and a plurality of electrical components mounted on and connected to said conductive paths on said top surface of said insulating base major planar portion, said insulating circuit base of said major planar portion having a bottom surface mounted adjacent said top surface of said heat sink plate portion;
wherein said through pins are electrically connected to said conductive paths and are positioned adjacent associated through holes in said insulating circuit base, and wherein said through pins, as they extend into said heat sink plate portion through holes are surrounded by concentric high dielectric constant spacer so as to provide a substantial capacitance between said through pins and said heat sink plate portion.

26. An electronic circuit module comprising:
connector means having a main insulating body with a plurality of separate through pins therein each extending at least from top to bottom opposite surfaces of said main body;
a thermally conductive heat sink means having a central plate portion with a plurality of through holes therein extending between top and bottom opposite surfaces of said central plate portion, said central plate portion bottom surface mounted adjacent said main body top surface with each of said plurality of pins extending into an associated one of said through holes in said central plate portion; and circuit board means having a plurality of conductive paths on a top surface of a major planar portion of an insulating circuit base, and a plurality of electrical components mounted on and connected to said conductive paths on said top surface of said insulating base major planar portion, said insulating circuit base of said major planar portion having a bottom surface mounted adjacent said top surface of said heat sink plate portion;

wherein said through pins are electrically connected to said conductive paths and are positioned adjacent associated through holes in said insulating circuit base, and wherein at least some of said plurality of components are positioned on said insulating circuit base top surface between said plurality of through pin associated through holes in said insulating circuit base, and wherein said heat sink means includes a recessed portion bounded by at least said bottom surface of said central plate portion, at least a substantial portion of said connector means main body being received in said recessed portion.

27. An electronic circuit module according to claim 26 wherein said heat sink means includes heat sink cooling fins peripherally disposed about and connected to peripheral portions of said heat sink plate portion.

28. An electronic circuit module according to claim 26 wherein said connector means main body comprises an insulating material having a metallic ground path embedded therein, at least several of said through pins being directly electrically DC connected thereto by a low resistance connection.

29. An electronic circuit module according to claim 26 wherein said main connector body includes extending projections thereof which surround said through pins as said pins extend into said through holes in said plate portion of said heat sink means.

30. An electronic circuit module according to claim 26 wherein said connector main body comprises a plastic part molded around said through pins so as to form an integral pin and connector body assembly.

31. An electronic circuit module according to claim 30 wherein said connector body comprises a preformed molded plastic part into which connector pins are subsequently inserted to form an assembly comprising said connector body and said through pins.

32. An electronic circuit module comprising:

connector means having a main insulating body with a plurality of separate through pins therein each extending at least from top to bottom surfaces of said main body;

a thermally conductive heat sink means having a central plate portion with top and bottom surfaces of said central plate portion, said plate portion bottom surface mounted facing said main body top surface; and circuit board means having a plurality of conductive paths on a top surface of a major planar portion on an insulating circuit base, and a plurality of electrical components mounted on and connected to said conductive paths on said top surface of said insulating circuit base major planar portion, said insulating circuit base having a bottom surface mounted adjacent said top surface of said heat sink plate portion;

wherein said through pins are electrically connected to said conductive paths via an integral extension of said insulating circuit base and wherein a planar portion of said extension is positioned on said connector means top surface and has conductive paths thereon connected to said plurality of components and adjacent and in connection with said through pins in said connector means.

33. An electronic circuit module comprising:

connector means having a main insulating body with a plurality of separate through pins therein each extending at least from top to bottom opposite surfaces of said main body; and circuit board means having a plurality of conductive paths on a top surface of a major planar portion of an insulating circuit base, and a plurality of electrical components mounted on and connected to said conductive paths on said top surface of said insulating base major planar portion, said insulating circuit base of said major planar portion having a bottom surface mounted facing said top surface of said connector main insulating body and conductive paths on said bottom surface, means for electrically connecting the top and bottom surface conductive paths;

wherein said through pins are electrically connected to said conductive paths on said top surface of said insulating base major planar portion and are positioned adjacent and below and are electrically connected and soldered to said conductive paths provided on said bottom surface of said insulating circuit base.

34. An electronic circuit module according to claim 33 which includes a heat sink central plate portion having top and bottom surfaces with through holes extending therebetween, said heat sink central plate portion positioned between said connector means main body and said circuit board means with said through pins extending into said heat sink central plate portion through holes.

* * * * *